United States Patent [19]
Fugo

[11] Patent Number: 5,781,049
[45] Date of Patent: Jul. 14, 1998

[54] METHOD OF TRANSMITTING CLOCK SIGNAL AND DEVICE EMPLOYING THE SAME

[75] Inventor: Masatoshi Fugo, Yamagata, Japan

[73] Assignee: NEC Corporation, Tokyo, Japan

[21] Appl. No.: 844,697

[22] Filed: Apr. 25, 1997

[30] Foreign Application Priority Data

May 21, 1996 [JP] Japan ................................. 8-125777

[51] Int. Cl.$^6$ ...................................................... H03K 5/15
[52] U.S. Cl. ........................... 327/166; 327/165; 327/291; 327/299
[58] Field of Search ................................. 327/165, 166, 327/170, 291, 299

[56] References Cited

U.S. PATENT DOCUMENTS

| | | | |
|---|---|---|---|
| 4,665,535 | 5/1987 | Nagasawa | 375/120 |
| 5,282,223 | 1/1994 | Muramatsu | 375/4 |

FOREIGN PATENT DOCUMENTS

H4-10011  1/1992  Japan.

*Primary Examiner*—Timothy P. Callahan
*Assistant Examiner*—An T. Luu
*Attorney, Agent, or Firm*—Laff, Whitesel, Conte & Saret, Ltd.

[57] ABSTRACT

A frequency divider 1 on the transmitting side divides the frequency of a clock signal of period T by 8, generates a pulse signal P2 of pulse width 4T and duty ratio 50%, and outputs the result to a shift register 2. The shift register 2 generates pulse signals P3-1, P3-2, P3-3, and P3-4 by giving delays 0, T, 2T, and 3T to the pulse signal P2, and sends them to transmission lines 101, 102, 103, and 104, respectively. Edge detectors 3-1, 3-2, 3-3, and 3-4 on the receiving side detect respectively the leading edges and the trailing edges of the pulse signals P3-1, P3-2, P3-3, and P3-4, and output edge detection signals P4-1, P4-2, P4-3, and P4-4. An OR gate 4 combines these edge detection signals. A clock regenerator 5 generates a regenerated signal P6 having the frequency equal to that of the clock signal P1 based on the combined edge detection signal P5.

4 Claims, 2 Drawing Sheets

METHOD OF TRANSMITTING CLOCK SIGNAL AND DEVICE EMPLOYING THE SAME

BACKGROUND OF THE INVENTION

The present invention relates to a clock signal transmission technique, and more particularly to a high frequency clock signal transmission technique.

In recent years, in order to increase the data transfer rate, a tendency of increasing the frequency of the clock signal, which indicates the timing of the transfer data and is transmitted along with the data, is recognizable. However, as the frequency of the transmitted clock signal goes up, the clock signal on the transmission line undergoes a waveform distortion which gives rise to variations in the pulse width or the duly ratio. The variations in the pulse width or the duty ratio are responsible for the data transfer errors.

A technique for resolving such a problem is disclosed in Japanese Laid-Open Patent Publication No. H4-10011. According to the technique disclosed in the publication, the transmitting side sends two signals, namely, a clock signal and its inverted signal, to the receiving side via respective transmission lines. On the receiving side, the two received signals are respectively frequency divided by 2, and the clock signal on the receiving side is obtained by subjecting these signals frequency divided by 2 to exclusive OR operation.

However, according to this prior art, as the frequency of the clock signal becomes higher, waveform distortions occur in the clock signal as well as in the inverted signal, which makes it difficult to know precisely the reception timings of data which are sent along with the clock signal.

SUMMARY OF THE INVENTION

The main object of the present invention is to provide a clock signal transmission method, and a device adopting the same, which can mitigate the effect of the waveform distortion on the transmission lines even when the frequency of the transmitted clock signal becomes high.

In accordance with this invention, on the transmitting side, a transmitting side clock signal of period T is frequency divided by 2n (n is a nonzero integer) to convert it to a first pulse signal of period 2nT, and n pieces of second pulse signals are generated by giving delays of 0, T, 2T, ..., and (n−1)T to the first pulse signal and these n pieces of second pulse signals are transmitted via a plurality of transmission lines.

On the receiving side, these n pieces of second pulse signals are received to detect the leading edges and trailing edges of these pulse signals, and the receiving side clock signal is generated based on timing signals that show the leading and trailing edges of these n pieces of second pulse signals.

In this invention, the waveform distortion is made less likely to occur on the transmission lines since the frequencies of the n pieces of the pulse signals transmitted via the transmission lines are ½n of the frequency of the transmitting side clock signal. Consequently, this invention is capable of generating the receiving side clock signal with more precise timings than in the prior art.

DETAILED DESCRIPTION OF THE PREFERRED EMBODIMENT

Figure 1:
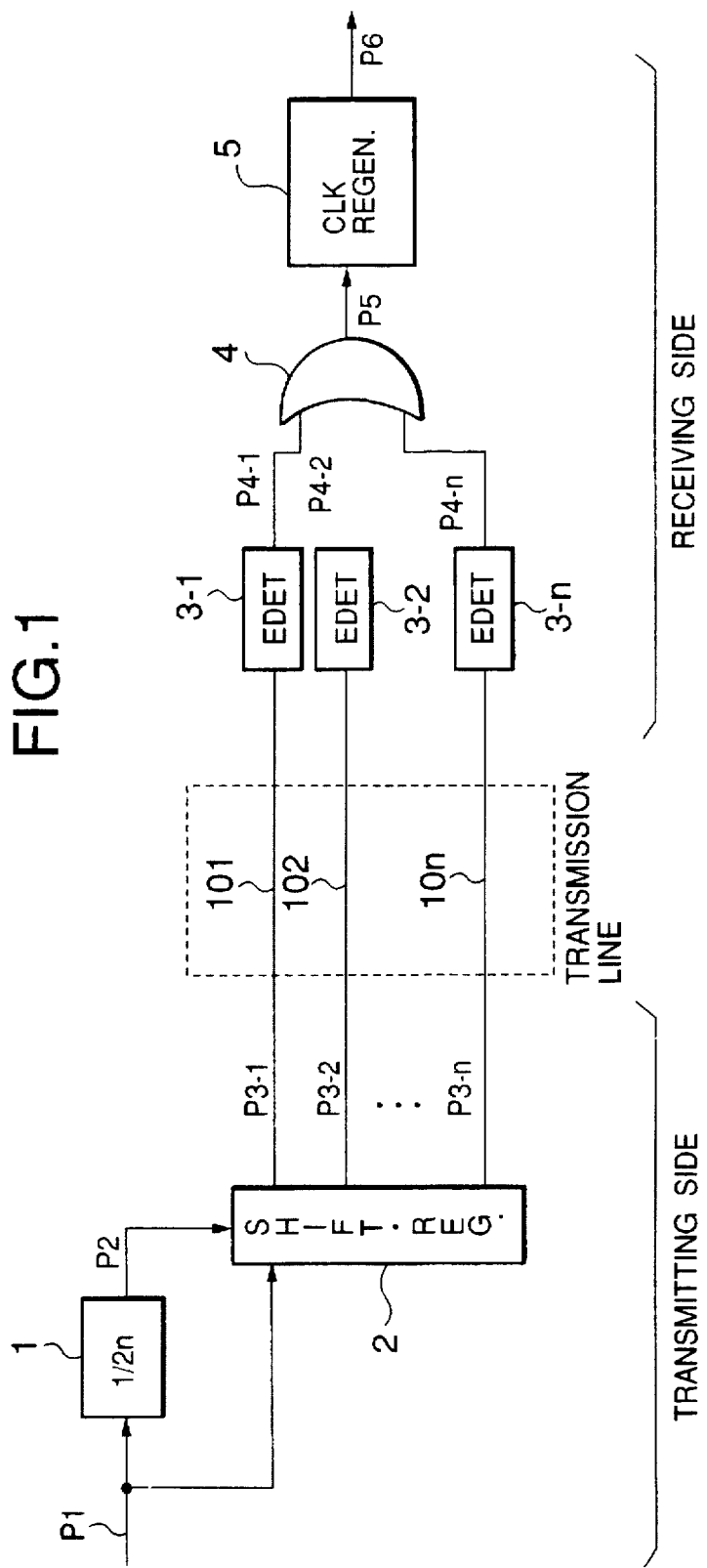
FIG. 1 is a block diagram showing an embodiment of the invention.

Referring to the drawings, the present invention will be described next. FIG. 1 is a block diagram showing an embodiment of this invention.

The equipment on the transmitting side includes a frequency divider 1 which divides the frequency of a transmitting side clock signal P1 by 2n and outputs a first pulse signal P2; and a shift register 2 which receives the first pulse signal P2, generates n second pulse signals P3-1, P3-2, ..., and P3-n by giving delays 0, T, 2T, ..., and (n−1)T to the first pulse signal P2, based on the clock signal P1 on the transmitting side, and outputs them to transmission lines 101, 102, ..., and 10n, respectively.

On the transmitting side, the frequency divider 1 divides the frequency of the clock signal P1 with period T by 2 n to generate a first pulse signal P2 of pulse width nT and duty ratio 50%, and outputs it to the shift register 2. The shift register 2 having n output terminals generates n second pulse signals P3-1, P3-2, ..., and P3-n by giving delays 0, T, 2T, ..., and (n−1)T to the first pulse signal P2, and outputs them from n output terminals to the transmission lines 101, 102, ..., and 10n.

Figure 2:
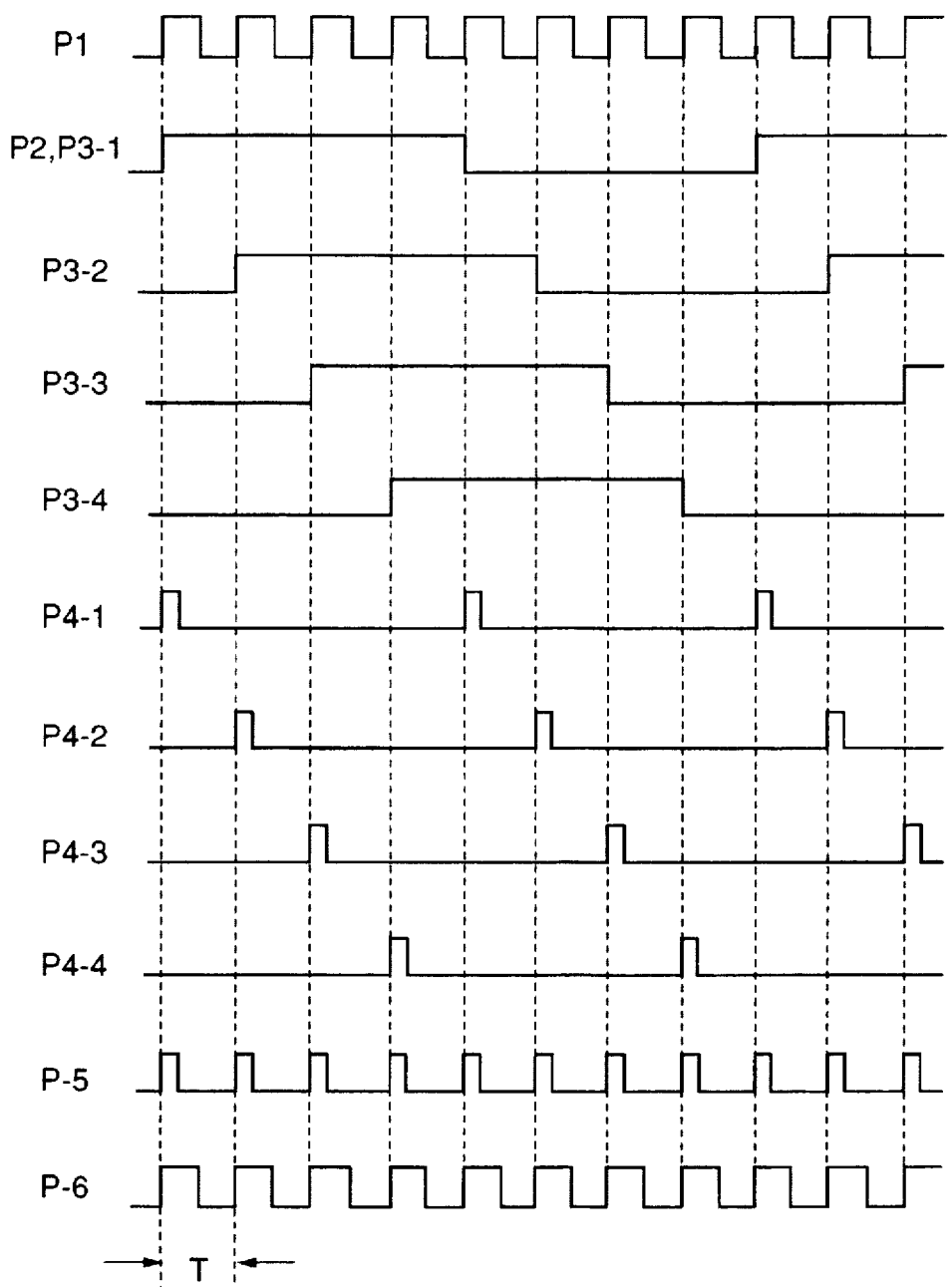
FIG. 2 is a timing chart showing an example of each of the signals shown in FIG. 1.

FIG. 2 shows the timings of respective signals for the case of n=4. In this case, the frequency of the clock signal P1 with period T is divided by 2×4 by the frequency divider 1 to convert it to a first pulse signal P1 of pulse width 4T and duty ratio 50%. In response to the input clock signal P1, the shift register 2 sequentially shifts the first pulse signal P2 to generate n second pulse signals P3-1, P3-2, P3-3, and P3-4 by delaying the first pulse signal P1 by 0, T, 2T, and 3T, respectively, and outputs them to 4 transmission lines 101, 102, 103, and 104, respectively.

On the other hand, the receiving side equipment includes n edge detectors 3-1, 3-2, ..., and 3-n which detect the leading edges and the trailing edges of the reception signals P3-1, P3-2, ..., and P3-n supplied by the transmission lines 101, 102, ..., and 10n, and output edge detection signals P4-1, P4-2, ..., and P4-n; a logic circuit 4 which generates a third pulse signal P5 by combining the edge detection signals P4-1, P4-2, and P4-n; and a clock regenerator 6 which generates a regenerated clock signal P6 based on the third pulse signal P5.

The clock regenerator 5 has a built-in phase locked loop (PLL), controls the oscillation frequency of a voltage controlled oscillator (VCO) within the PLL based on the third pulse signal P5, and generates a regenerated clock signal P6 which has the same frequency as that of the clock signal P1.

Referring again to FIG. 2, the edge detectors 3-1, 3-2, 3-3, and 3-4 receive the second pulse signals P3-1, P3-2, P3-3, and P3-4, transmitted through the transmission lines 101, 102, 103, and 104, respectively, and output edge detection signals P4-1, P4-2, P4-3, and P4-4 by detecting respective leading edges and trailing edges of the second pulse signals. These edge detection signals are combined by an OR circuit 4 and the result is output as the third pulse signal P5. The frequency of this timing signal P5 agrees with the frequency of the transmitting side clock signal P1. This timing signal P5 is supplied to the clock regenerator 5 having the built-in PLL which generates the receiving side clock signal P6 of duty ratio 50%.

As described in the above, according to this invention a clock signal having a frequency 1/T is frequency-divided by 2n to generate a pulse signal of frequency ½nT and duty ratio of 50%. The pulse signal of frequency ½nT is delayed by 0, T, 2T, . . . , and (n−1)T and the resulting signals are transmitted via n transmission lines. In this way, it is possible to transmit a clock signal by alleviating the influence of waveform distortion which is generated on the transmission lines.

Modifications of the invention herein disclosed will occur to a person skilled in the art and all such modifications are deemed to be within the scope of the invention as defined by the appended claims.

What is claimed is:

1. A clock signal transmission equipment for transmitting a clock signal of period T from a transmitting side to a receiving side, wherein, said transmitting side comprises:

frequency dividing means which generates a first pulse signal of duty ratio 50% and pulse width nT (n being nonzero positive integer) obtained by dividing the frequency of said clock signal of period T by 2n; and transmission pulse generating means which generates n pieces of second pulse signals by giving delays of 0, T, 2T, . . . , and (n−1)T to said first pulse signal, and said receiving side comprises:

pulse detecting means which receives respective members of said n pieces of second pulse signals, detects the leading edge and the trailing edge of these n pieces of second pulse signals, and generates a third pulse signal which shows the leading edges and the trailing edges of all of these n pieces of second pulse signals; and clock regenerating means which regenerates said clock signal of period T based on said third pulse signal.

2. The clock signal transmission equipment as claimed in claim 1, wherein said transmission pulse generating means comprises a shift register which receives said first pulse signal to its data input terminal and receives said clock signal of period T to its clock input terminal.

3. The clock signal transmission equipment as claimed in claim 1, wherein said pulse detecting means comprises n pieces of edge detection circuits which receive respective members of said n pieces of second pulse signals and generate detection signals by detecting the leading edges and the trailing edges of the received second pulse signals, and a logic circuit which generates said third pulse signal by combining the detection signals received from said n pieces of edge detection circuits.

4. A method of transmitting a clock signal of period T from a transmitting side to a receiving side, wherein said transmitting side generates a first pulse signal of duty ratio 50% and pulse width nT by dividing the frequency of said clock signal of period T by 2n (n being a nonzero positive integer); and generates n pieces of second pulse signals by giving delays of 0, T, 2T, . . . , and (n−1)T to said first pulse signal, and said receiving side receives said n pieces of second pulse signals; generates a third pulse signal showing the leading edges and the training edges of said n pieces of the second pulse signals by detecting the leading edges and the trailing edges of these n pieces of second pulse signals; and regenerates said clock signal of period T based on said third pulse signal.

* * * * *